United States Patent
Ishizawa et al.

(10) Patent No.: US 7,125,100 B2
(45) Date of Patent: *Oct. 24, 2006

(54) TERMINALS FOR CIRCUIT BOARD

(75) Inventors: Taku Ishizawa, Nagano-ken (JP);
Takakazu Fukano, Nagano-ken (JP);
Toshihisa Saruta, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/634,428

(22) Filed: Aug. 5, 2003

(65) Prior Publication Data

US 2004/0046822 A1    Mar. 11, 2004

Related U.S. Application Data

(63) Continuation of application No. 10/028,474, filed on Dec. 19, 2001, now Pat. No. 6,648,445.

(30) Foreign Application Priority Data

Dec. 26, 2000  (JP) .............................. 2000-395925

(51) Int. Cl.
*B41J 2/14*    (2006.01)
(52) U.S. Cl. .............................. 347/50; 347/9; 347/10; 347/19
(58) Field of Classification Search ................ 347/19, 347/10, 12, 86, 85, 5, 9, 11, 190, 84, 50, 7
See application file for complete search history.

(56) References Cited

U.S. PATENT DOCUMENTS

| 5,411,343 | A |   | 5/1995 | Childers |
| 5,471,163 | A |   | 11/1995 | Childers |
| 5,610,635 | A | * | 3/1997 | Murray et al. ................. 347/19 |
| 5,646,660 | A |   | 7/1997 | Murray |
| 5,748,179 | A | * | 5/1998 | Ito et al. ...................... 349/152 |
| 5,838,549 | A | * | 11/1998 | Nagata et al. ............... 361/794 |
| 6,000,773 | A |   | 12/1999 | Murray et al. |
| 6,039,428 | A |   | 3/2000 | Juve |
| 6,161,915 | A |   | 12/2000 | Bolash et al. |
| 6,168,262 | B1 |   | 1/2001 | Clark et al. |
| 6,502,917 | B1 |   | 1/2003 | Shinada et al. |
| 6,575,548 | B1 | * | 6/2003 | Corrigan et al. ............... 347/19 |

(Continued)

FOREIGN PATENT DOCUMENTS

DE    197 48 857 A1    8/1998

(Continued)

OTHER PUBLICATIONS

Office action mailed Jul. 6, 2004 in Japanese application JP2000-395925 and English translation.

(Continued)

*Primary Examiner*—Stephen Meier
*Assistant Examiner*—Lam S. Nguyen
(74) *Attorney, Agent, or Firm*—Stroock & Stroock & Lavan LLP

(57) ABSTRACT

Circuit board 10 is of substantially rectangular shape, provided in the upper half of the juxtaposed face 13 with a substantially circular test terminal 20. In the lower half are provided a plurality of substantially rectangular terminals 21–27, arrayed in two rows, i.e., an upper and lower row, the upper row containing an I/O terminal 21 for data input/output, a power supply terminal 22 for supplying power, and a chip select terminal 23 for input of a chip select signal CS. The lower row of juxtaposed face 13 contains a ground terminal 24, a read/write terminal 25 for inputting read/write control signals W/R, a clock terminal 26 for inputting a clock signal CLK, and a ground terminal 27.

14 Claims, 11 Drawing Sheets

U.S. PATENT DOCUMENTS 6,648,445 B1 * 11/2003 Ishizawa et al. .............. 347/19
2001/0019343 A1    9/2001 Walker et al.

FOREIGN PATENT DOCUMENTS

| EP | 0412459 A2 | 2/1991 |
| EP | 0 571 093 A2 | 11/1993 |
| EP | 0710568 A2 | 5/1996 |
| EP | 0812693 A1 | 12/1997 |
| EP | 0832747 A2 | 4/1998 |
| EP | 0 997 297 A1 | 5/2000 |
| WO | WO-98/52762 A2 | 11/1998 |
| WO | WO 99/59823 A1 | 11/1999 |

OTHER PUBLICATIONS

Search Report in European Patent Appln. No. 05018578.4, dated Apr. 6, 2006.

Communication of a Notice of Opposition and Notice of Opposition in European Patent No. 1 219 437 B1 (Jun. 14, 2006), with English Translation of Notice.

* cited by examiner

TERMINALS FOR CIRCUIT BOARD

CROSS-REFERENCE TO RELATED APPLICATION

This application is a continuation of application Ser. No. 10/028,474, filed on Dec. 19, 2001 now U.S. Pat. No. 6,648,445.

BACKGROUND OF THE INVENTION

1. Field of the Invention

The present invention relates to a circuit board provided to a marking material receptacle that houses a marking material for print.

2. Related Art

In recent years, there has been developed ink cartridges of a type equipped with a circuit board that has a storage device for storing data relating to the ink contained in the ink cartridge. Such circuit boards are equipped with terminals for receiving power, data for storage, etc. from a printer, or for sending stored data to a printer.

The following description of a conventional terminal arrangement makes reference to FIG. 12. Circuit board 500 has a first terminal row with a ground terminal 510 in its center, a data I/O terminal 520 to a first side thereof, and a read/write signal terminal 530 to a second side thereof; and a second terminal row, located above the first terminal row, with a power terminal 550 in its center, a clock signal terminal 540 to a first side thereof, and a chip select signal terminal 560 to a second side thereof.

Printer 580 is provided with contact pins 570 corresponding to each of these terminals 510–560; when the ink cartridge is installed in the mounting portion of the printer, terminals 510–560 come into contact with the corresponding contact pins 570 to enable power, data, etc. to be exchanged between the circuit board 500 and the printer 580. The ground terminal 510 is used to allow the printer to determine if the ink cartridge is correctly installed; ink cartridge installation is detected by sensing contact (electrical continuity) between the ground terminal pin of the printer 580 and the ground terminal 510.

However, in the past there has been the problem that in some instances electrical continuity is sensed, and ink cartridge consequently determined to be installed, even where terminals 510–560 and contact pins 570 are not in contact due to misalignment of the circuit board 500, etc. A resulting problem in such instances is that despite the determination that the ink cartridge is installed, the data stored in the storage device cannot be read.

SUMMARY OF THE INVENTION

In view of this problem, it is an object of the present invention to provide a terminal arrangement for a circuit board which permits accurate detection of contact with the terminals of the circuit board. It is a further object to provide a marking material receptacle affording accurate detection of whether the marking material receptacle has been installed.

To solve this problem, the invention in a first aspect thereof provides a circuit board comprising a storage device for storing data relating to a marking material for print. The circuit board according to the first aspect herein comprises: at least two ground terminals arranged on said circuit board at two edges thereof that are located on one axis thereof; and a plurality of terminals arranged on said circuit board, for read/write operations on said data relating to a marking material.

According to the circuit board of the first aspect herein, there are provided at least two ground terminals arranged on said circuit board at two edges thereof that are located on one axis thereof, thereby affording accurate detection of contact with the terminals on the circuit board.

In the circuit board of the first aspect herein, said plurality of terminals and said ground terminals may be arranged in a single row, with two of said at least two ground terminals being located at the outermost ends of said row. With this arrangement, contact with the terminals on the circuit board can be detected accurately.

In the circuit board of the first aspect herein, said plurality of terminals may be arranged to form a plurality of rows, with two of said at least two ground terminals being located at the outermost ends of one of said plurality of rows. Said plurality of terminals may include a clock signal terminal, with said clock signal terminal being located between two of said at least two ground terminals. With this arrangement, the clock signal can be stabilized. Further, said plurality of terminals may include a power supply terminal, with two of said at least two ground terminals being located at the outermost ends of a row different than the row that contains said power supply terminal. This arrangement prevents short-circuiting between the power supply terminal and the ground terminals.

In the circuit board of the first aspect herein, said plurality of terminals may include a power supply terminal and a control signal terminal, and said at least two ground terminals are not the terminals in closest proximity to said power supply terminal. This arrangement prevents short-circuiting between the power supply terminal and the ground terminals.

In the circuit board of the first aspect herein, said plurality of terminals may include a data I/O terminal, a power supply terminal, a select signal terminal, a read/write control signal terminal, and a clock signal terminal, and said plurality of rows may have a first row wherein said data I/O terminal and said select signal terminal are located to either side of said power supply terminal, and a second row wherein said read/write control signal terminal and said clock signal terminal are located between said two ground terminals, said first row being located closer to the center of said circuit board than is said second row, and with said terminals in said first row and said terminals in said second row arranged in alternating fashion. This arrangement prevents short-circuiting between terminals, and also prevents unwanted contact of terminals.

In the circuit board of the first aspect herein, said plurality of terminals may be arranged at intervals of approximately 1 mm in the direction of formation of said rows.

In a second aspect, the invention provides a circuit board comprising a storage device for storing data relating to a marking material, and provided to a marking material cartridge having a substantially rectangular shape. The circuit board according to this second embodiment comprises: two ground terminals arranged on said circuit board at two edges thereof along one side thereof; and a plurality of terminals arranged parallel to one side of said circuit board, and used for storing said data.

According to the circuit board of the second aspect herein, two ground terminals are arranged on the circuit board at two edges thereof, thereby affording accurate detection of contact with the terminals on the circuit board.

In the circuit board of the second aspect herein, said plurality of terminals may form a plurality or rows parallel to one side of said circuit board, and said two ground terminals may be arranged at the outermost ends of one of said plurality of rows. Said plurality of terminals include a clock signal terminal, a control signal terminal, and a power supply terminal, with said two terminals being located at the outermost ends of a row that is different from the row that includes said power supply terminal, and that includes said clock signal terminal. This arrangement affords working effects similar to the circuit board pertaining to the first aspect.

In a third aspect, the invention provides a marking material receptacle configured to be used with a printing device. The marking material receptacle pertaining to this third aspect comprises: a receptacle chamber for housing said marking material; and a circuit board having a storage device for storing data relating to the marking material housed in said receptacle chamber, said circuit board having a plurality of terminals arranged thereon along one axis thereof, and at least two ground terminals arranged on said circuit board at two edges thereof that are located on one axis thereof.

In the marking material receptacle pertaining to the third aspect herein, there is provided a circuit board having arranged thereon at least two ground terminals, located at two edges thereof that are located on one axis thereof, thereby affording accurate detection of whether the marking material receptacle has been installed. The marking material is used for printing texts and/or images.

In the marking material receptacle pertaining to the third aspect herein, said plurality of terminals and said terminals may be arranged in a single row, with two of said at least two ground terminals being located at the outermost ends of said row. Said plurality of terminals may be arranged to form a plurality of rows, with two of said at least two ground terminals being located at the outermost ends of one of said plurality of rows. These arrangements as well afford accurate detection of whether the marking material receptacle has been installed.

In the marking material receptacle pertaining to the third aspect herein, said plurality of terminals may include a power supply terminal, control signal terminal, and clock signal terminal, with two of said at least two ground terminals being located at the outermost ends of a row that is different from the row that includes said power supply terminal, and in the same row as said clock signal terminal. This arrangement stabilizes the clock signal, and prevents short circuiting between the ground terminal and power supply terminal.

In the marking material receptacle pertaining to the third aspect herein, said plurality of terminals may include a data I/O terminal, a power supply terminal, a select signal terminal, a read/write control signal terminal, and a clock signal terminal; and said plurality of rows may have a first row wherein said data I/O terminal and said select signal terminal are located to either side of said power supply terminal, and a second row wherein said read/write control signal terminal and said clock signal terminal are located between said two ground terminals, with said first row being located closer to the center of said circuit board than is said second row, and with said terminals in said first row and said terminals in said second row arranged in alternating fashion. This arrangement prevents short-circuiting between terminals, and also prevents unwanted contact of terminals.

In the marking material receptacle pertaining to the third aspect herein, said plurality of terminals may be arranged at intervals of approximately 1 mm in the direction of formation of said rows. While incorrect installation of the marking material receptacle may result in faulty contact of terminals on the circuit board, with this arrangement, any faulty contact of terminals on the circuit board can be detected appropriately by means of situating the ground terminals at both edges or the outermost edge of the circuit board.

In the marking material receptacle pertaining to the third aspect herein, said marking material receptacle may be an ink cartridge, or a toner cartridge. In either case, accurate detection of cartridge installation will be required.

DETAILED DESCRIPTION OF THE PREFERRED EMBODIMENTS

Figure 1:
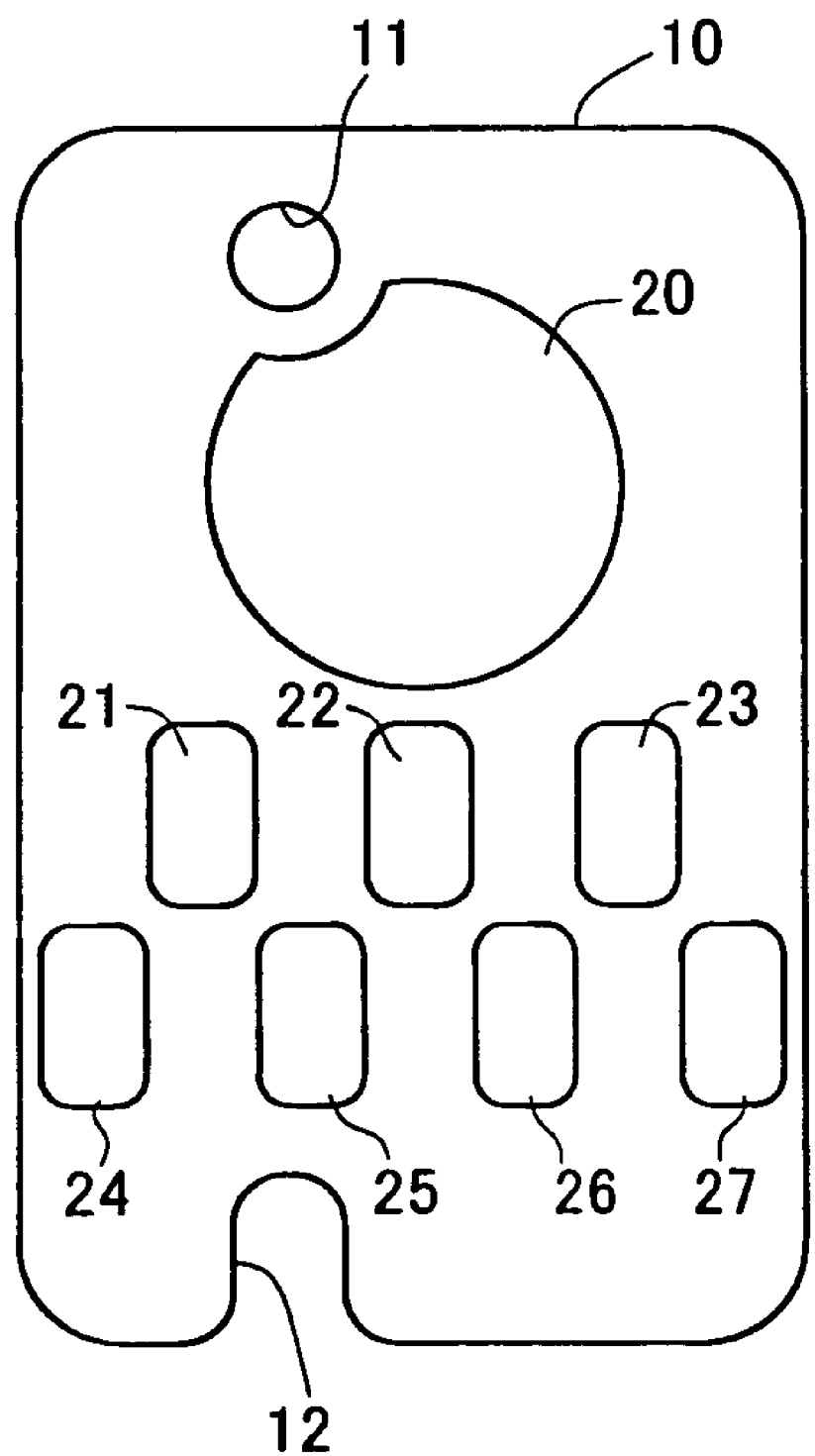
FIG. 1 is an illustrative diagram of an exemplary circuit board terminal arrangement pertaining to a first embodiment.
Figure 2:
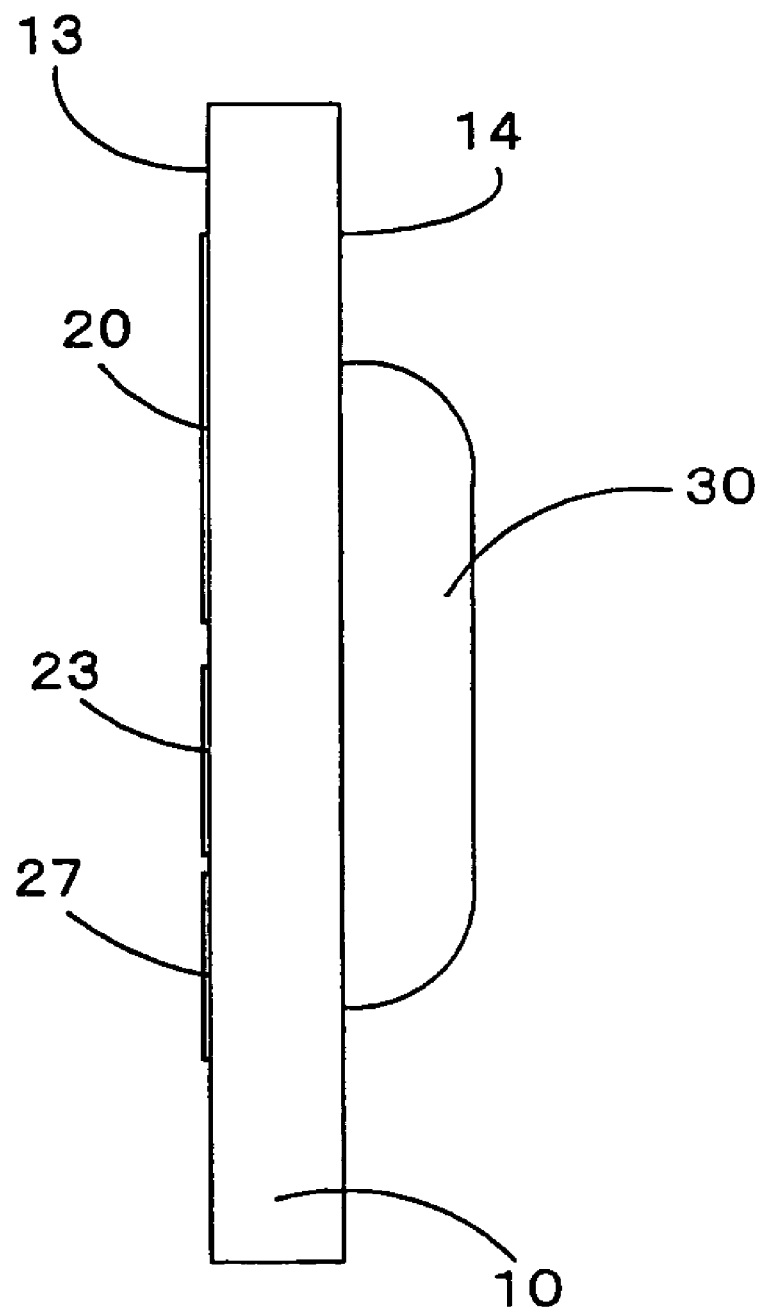
FIG. 2 is a side view of the circuit board shown in FIG. 1.
Figure 3:
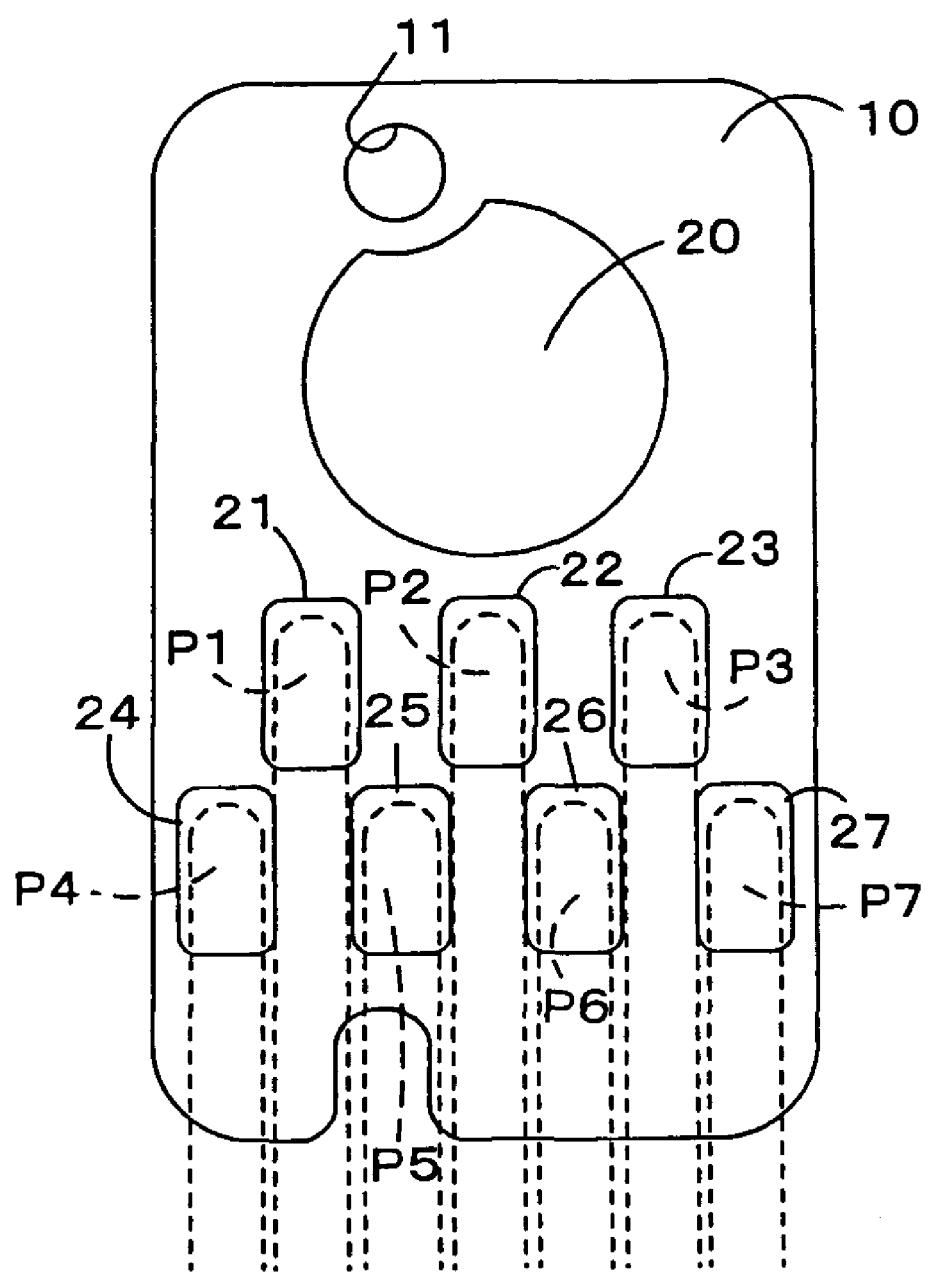
FIG. 3 is an illustrative diagram depicting contact of the terminals on a circuit board pertaining to a first embodiment with the contact pins of a printer.

A more complete understanding of the present invention will be gained through the following description of the embodiments in the order indicated below, making reference to the accompanying drawings. The description that follows is arranged in the following 6 sections, A–D A. Exemplary circuit board terminal arrangement pertaining to a first embodiment B. Exemplary circuit board circuit arrangement pertaining to a first embodiment C. Exemplary ink cartridge arrangement comprising circuit board pertaining to a first embodiment D. Other embodiments A. Exemplary Circuit Board Terminal Arrangement Pertaining to a First Embodiment The following description of a circuit board terminal arrangement pertaining to a first embodiment makes reference to FIGS. 1–3. FIG. 1 is an illustrative diagram of an exemplary circuit board terminal arrangement pertaining to a first embodiment. FIG. 2 is a side view of the circuit board shown in FIG. 1. FIG. 3 is an illustrative diagram depicting contact of the terminals on a circuit board pertaining to a first embodiment with the contact pins of a printer.

Circuit board 10 is of substantially rectangular shape, and comprises a through-hole 11 for positioning it during ink cartridge installation, and a notch 12, formed on the peripheral edge, for positioning it during ink cartridge installation. Circuit board 10 is provided, on the face 13 thereof juxtaposed to the printer, with a plurality of terminals 20–27 located, and on the face 14 thereof joined to the ink cartridge, with a storage device 30 connected to terminals 20–27 (see FIG. 2).

In the upper half of the printer-juxtaposed face 13 of circuit board 10 is provided a substantially circular test terminal 20 used to test the storage device 30 when shipped from the factory. In the lower half are provided a plurality of substantially rectangular terminals 21–27, arrayed in two rows, i.e., an upper and lower row. The terminals in the upper row are, proceeding from the left in FIG. 1, an I/O terminal 21 for data input/output, a power supply terminal 22 for supplying power, and a chip select terminal 23 for input of a chip select signal (select signal) CS for selectively activating storage device 30. The terminals in the lower row are, proceeding from the left in FIG. 1, a ground terminal 24, a read/write terminal 25 for inputting read/write control signals W/R for storage device 30, a clock terminal 26 for inputting a clock signal CLK (sync signal) for storage device 30, and a ground terminal 27.

As will be apparent from FIG. 1, in the circuit board 10 pertaining to the present embodiment, the ground terminals 24, 27 are located at the two ends of the lowermost of the two rows of terminals, with the other terminals 21–23, 25, 26 being located further inward from the ground terminals 24, 27. The clock terminal 26 is located between the ground terminals 24, 27. The ground terminals 24, 27 are placed in a different row from the power supply terminal 22, in a spatial relationship such that the gaps between the vicinities of these terminals and the vicinity of the power supply terminal 22 are not the shortest distance. That is, the ground terminals 24, 27 are not the terminals in closest proximity to the power supply terminal 22. In the present embodiment, "ground" refers to a signal reference voltage, and may be either positive or negative voltage.

In the present embodiment, circuit board 10 has dimensions of 11.9 mm height, 7.5 mm width, and 0.71 mm thickness. Terminal 21–27 dimensions are 1.8 mm height and 1.0 mm width. However, these dimensions are merely exemplary, and may differ by as much as about ±0.5 mm, for example. Gaps between adjacent terminals, for example, the distance between I/O terminal 21 and power supply terminal 22, is about 1 mm, for example. Gaps between terminals may also differ by as much as about ±0.5 mm, for example.

The following description of contact of the terminals on circuit board 10 herein with the contact pins of a printer makes reference to FIG. 3. The printer comprises contact pins P1–P7 corresponding to terminals 21–27; when the ink cartridge is installed in the mounting portion of the printer, the terminals come into contact with contact pins P1–P7, thus supplying power from the printer to storage device 30 of circuit board 10, and enabling data exchange between the printer and circuit board 30.

Ground terminals 24, 27 are used to allow the printer to determine if the ink cartridge has been installed correctly. When two ground terminal contact pins P4, P7 located on the printer contact the ground terminals 24, 27, the printer senses electrical continuity to detect installation of the ink cartridge.

The circuit board 10 in the present embodiment is provided with ground terminals 24, 27 located at two edges thereof, the areas that are most susceptible to the effects of vertical or horizontal tilt or misalignment with respect to the direction of the terminal arrays, and to faulty terminal-pin contact. Accordingly, if the printer detects contact between the ground terminals 24, 27 and the ground terminal contact pins P4, P7, it is extremely unlikely that the other terminals 21–23, 25, 26 are not in respective contact with contact pins P1–P3, P5, P6, thus avoiding the problem of an inability to access the storage device 30 despite detecting installation of the ink cartridge.

Further, since the ground terminals 24, 27 are not the terminals in closest proximity to the power supply terminal 22, short-circuiting between the power supply terminal 22 and the ground terminals 24, 27 may be prevented.

B. Exemplary Circuit Board Circuit Arrangement Pertaining to a First Embodiment

Figure 4:
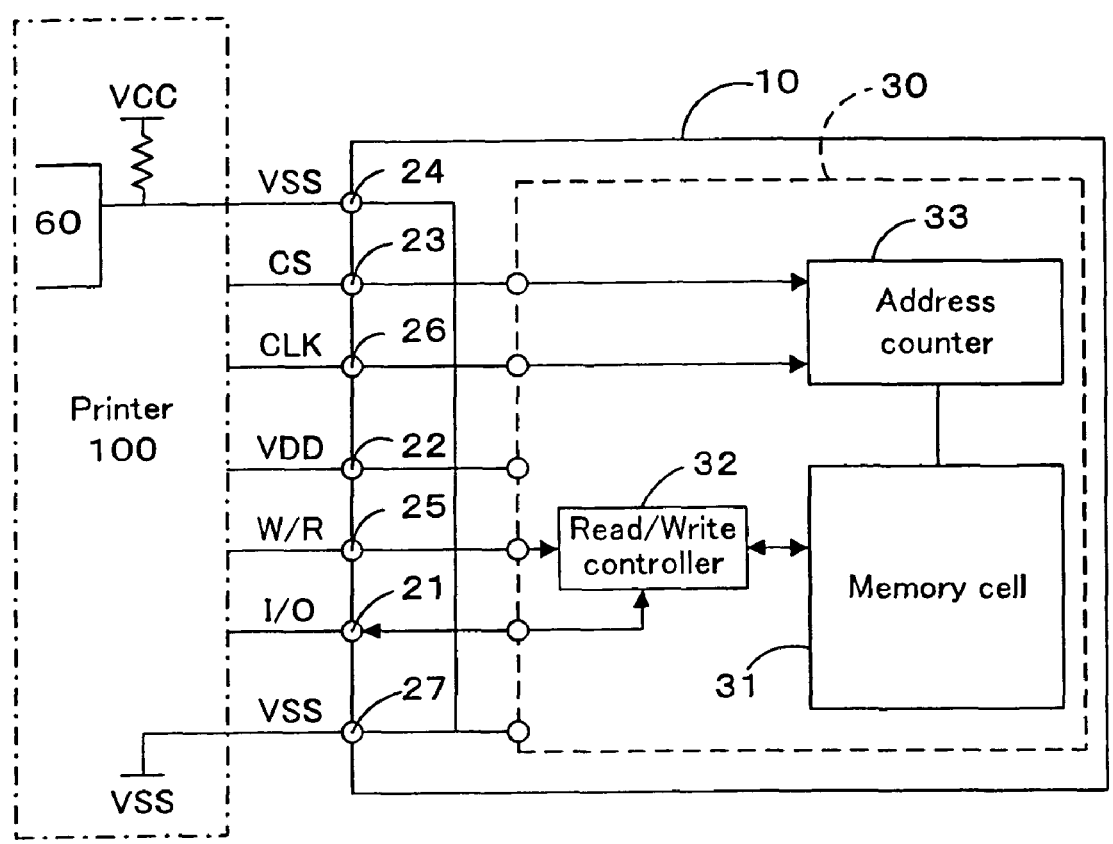
FIG. 4 is a block diagram depicting schematically the circuit arrangement of the circuit board pertaining to the first embodiment.

The following description of an exemplary circuit board circuit arrangement pertaining to a first embodiment makes reference to FIG. 4. FIG. 4 is a block diagram depicting schematically the circuit arrangement of the circuit board pertaining to the first embodiment.

As noted, circuit board 10 comprises a storage device 30 located on the face 13 thereof joined to the ink cartridge. The storage device 30 in the present embodiment is an EEPROM comprising a serially accessed memory cell 31, a read/write controller 32 for controlling data read/write operations to and from memory cell 31, and an address counter 33 for counting up, in sync with the clock signal CLK, during data read/write operations between printer 100 and memory cell 31 via read/write controller 32.

Contact pin P1 of printer 100 is used for input/output of data to and from printer 10; contact pin P2 is used to supply power supply voltage VDD from printer 100 to the power supply terminal 22 of circuit board 10. Contact pin P3 is used to send a chip select signal CS; contact pins P4 and P7 are used to supply pullup voltage VCC; contact pin P5 is used to send read/;write control signals; and contact pin P6 is used to send the clock signal CLK.

Contact pin P4 is coupled with a cartridge out sensing terminal of the central processing unit (CPU) 60 in printer 100, and is also coupled, via pullup resistance, to the cartridge out sensing power supply VCC, so as to have potential equal to the cartridge out voltage VCC. Contact pin P7 is grounded in printer 100 and has potential equal to ground voltage VSS.

Figure 5:
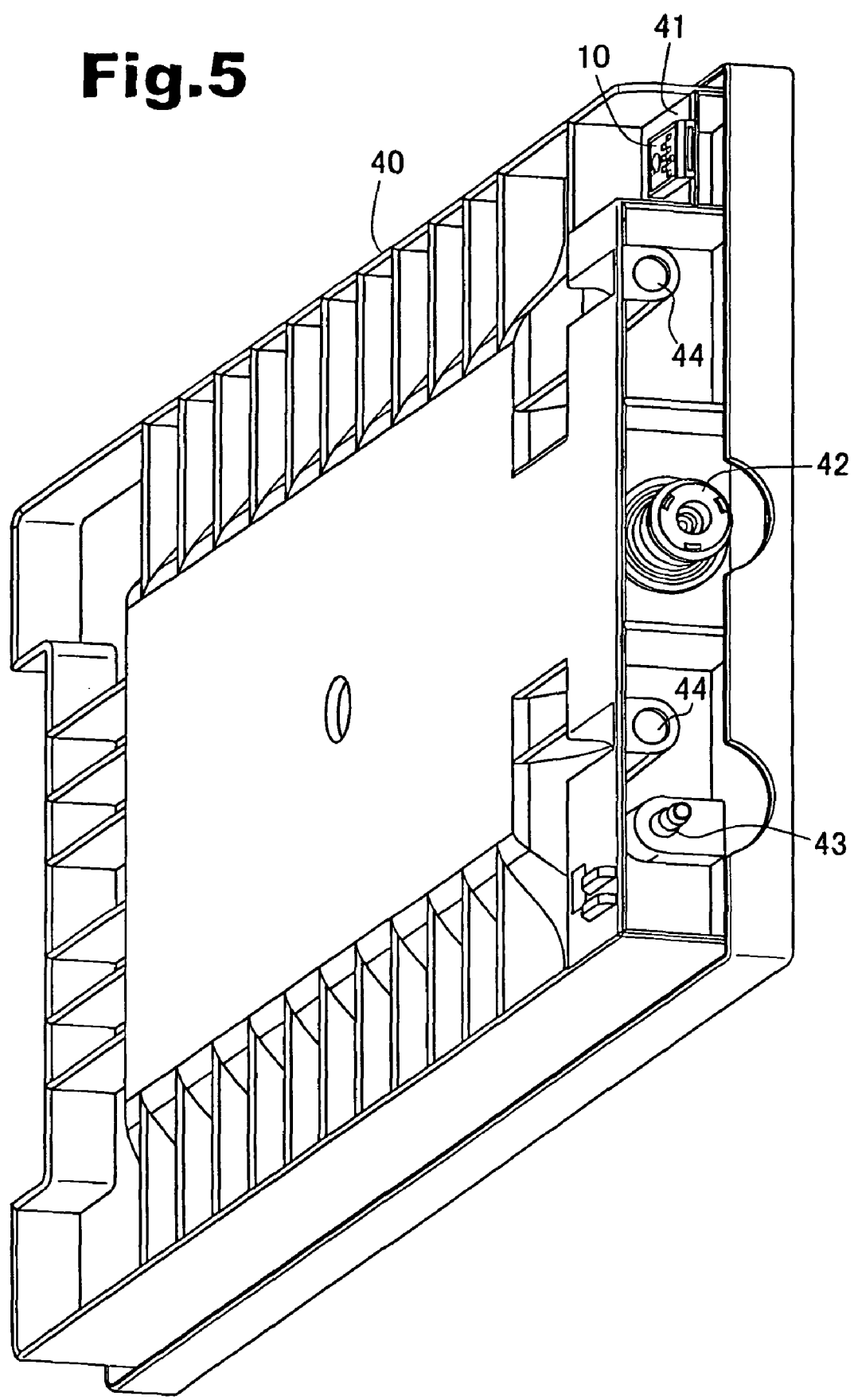
FIG. 5 is a perspective view of the general scheme of an ink cartridge comprising the circuit board of the first embodiment.
Figure 6:
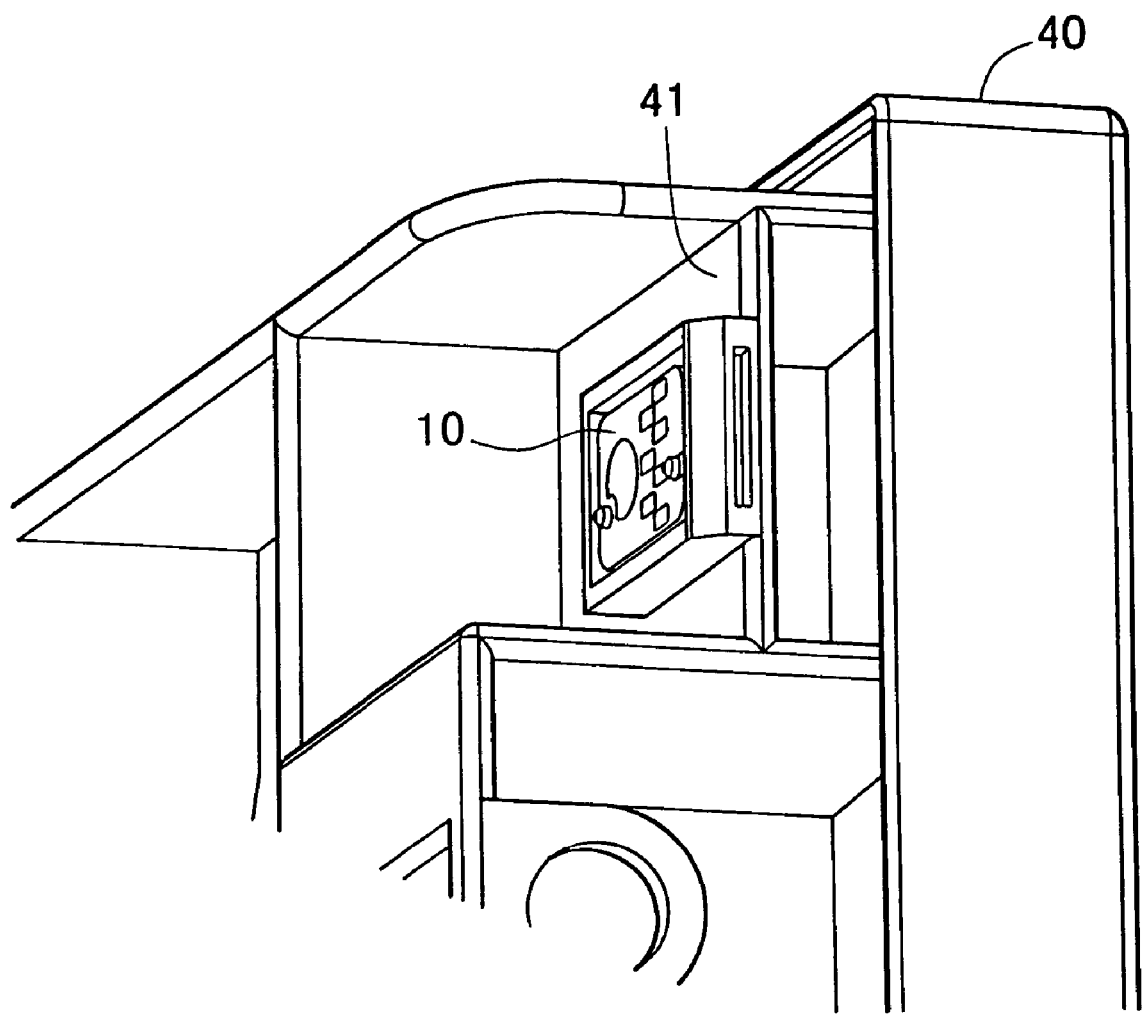
FIG. 6 is an enlarged view of the circuit board mounting portion in FIG. 4.
Figure 7:
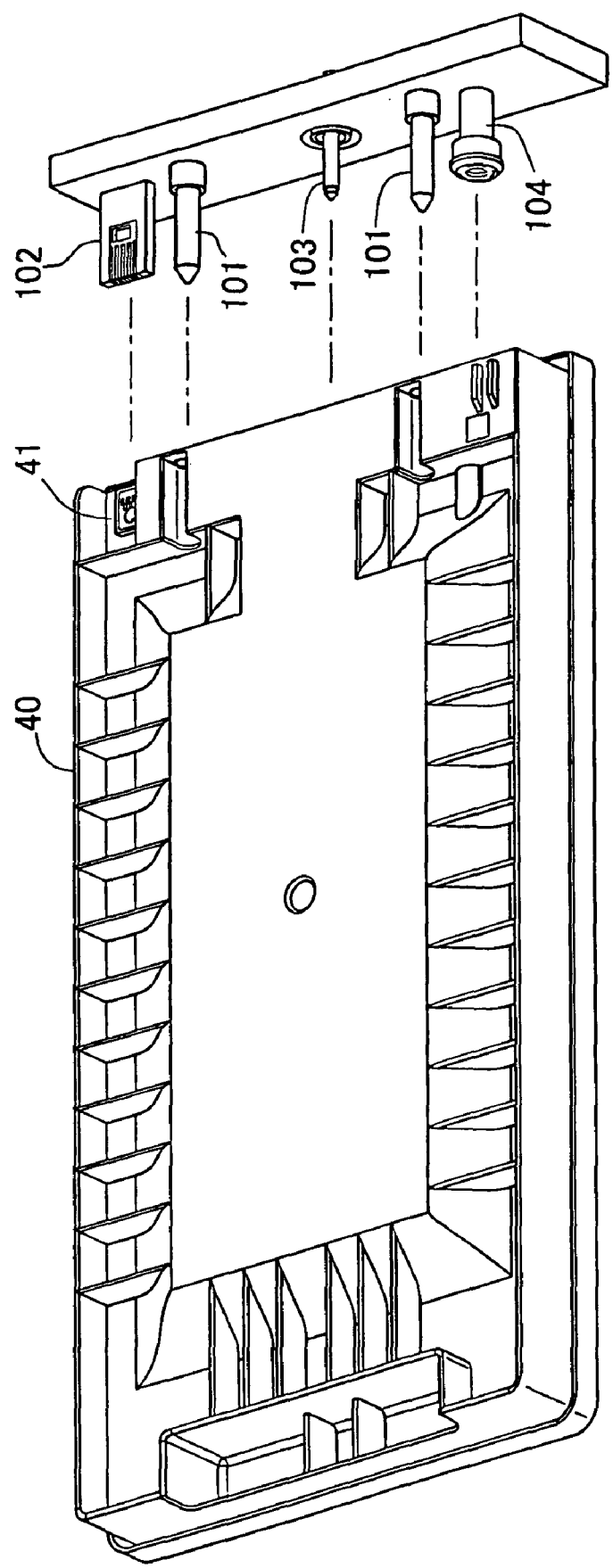
FIG. 7 is an illustrative diagram depicting the ink cartridge installed in the printer.

C. Exemplary Ink Cartridge Arrangement Comprising Circuit Board Pertaining to a First Embodiment The following description of an exemplary ink cartridge arrangement having installed thereon the circuit board 10 herein makes reference to FIGS. 5–7. FIG. 5 is a perspective view of the general scheme of an ink cartridge comprising the circuit board 10 of the first embodiment. FIG. 6 is an enlarged view of the circuit board 10 mounting portion in FIG. 4. FIG. 7 is an illustrative diagram depicting the ink cartridge installed in the printer.

Ink cartridge 40 is configured for installation in an "off carriage" type printer, i.e., one in which the ink cartridge is not installed on a carriage. Off carriage type printers are typically large-scale printers; the ink cartridges employed in such large-scale printers are typically larger in size than the ink cartridges employed in on-carriage type printers.

Ink cartridge 40 comprises a circuit board mounting portion 41 for mounting circuit board 10; an ink feed orifice 42 for supplying ink from ink cartridge 40 to the printer; an air feed orifice 43 allowing intake of air into ink cartridge 40 to allow smooth flow of ink; and guide portions 44 for installation in the printer. The exterior dimensions of ink cartridge 40 are such that the side thereof (i.e. the depth direction) extending perpendicular to the side on which the guide portions 44, etc. are formed (i.e. the width direction) is longer than the width direction. The relationship of the depthwise dimension to the widthwise direction of circuit board 10, expressed as a ratio of the two, is 15:1 or greater, for example.

As shown in FIG. 5, circuit board 10 is positioned by means of through-hole 11 and notch 12, and secured on the circuit board mounting portion 41 of ink cartridge 40.

When installing the ink cartridge 40 in the printer, the guide portions of ink cartridge 40 guide the guide pins 101 on the printer so that the circuit board mounting portion 41, ink feed orifice 42, and air feed orifice 43 are appropriately contacted/coupled with a contact pin 102, ink feed orifice 103, and air feed orifice 104 on the printer.

The following description of the process executed by printer 100 on circuit board 10 when the ink cartridge 40 is installed in printer 100 makes reference to FIG. 4.

Contact pin P7 of the printer 100 is grounded within the printer, and contact pin P4 is coupled to the cartridge out sensing terminal of CPU 60. When ink cartridge 40 is inserted into printer 100, the contact pins P1–P7 of the printer 100 come into contact with the terminals 21–27 of circuit board 10. At this point, if contact pins P4, P7 of the printer 100 are both in contact with the respective ground terminals 24, 27 of circuit board 10, CPU 60 detects ground voltage VSS. That is, when ink cartridge 40 is installed, printer 100 (CPU 60) detects electrical continuity of contact pins P4, P7 and circuit board 10 ground terminals 24, 27, and determines that the ink cartridge 40 is installed correctly.

If, on other hand, either of the contact pins P4, P7 is not in contact with the corresponding circuit board 10 ground terminal 24, 27, CPU 60 detects the cartridge out voltage VCC. That is, printer 100 cannot detect electrical continuity of contact pins P4, P7 and circuit board 10 ground terminals 24, 27, and determines that the ink cartridge 40 is not installed correctly.

If printer 100 detects electrical continuity of contact pins P4, P7 and circuit board 10 ground terminals 24, 27, and determines that the ink cartridge 40 is installed correctly, power VDD is supplied to power supply terminal 22, and a chip select signal CS is sent to the storage device 30 to be accessed.

Upon receiving chip select signal CS, storage device 30 becomes active and awaits a control signal from the printer 100. Where, for example, the printer 100 is to read data stored in storage device 30, a clock signal CLK corresponding to the desired address in memory cell 31 is input to clock terminal 26, and a read/write control signal W/R instructing a read operation is input to read/write terminal 25.

The clock signal CLK input to clock terminal 26 is input to address counter 33, whereupon the address counter 33 counts up the address, in sync with the input clock signal CLK, to indicate an address in memory cell 31. The read/write control signal W/R input via read/write terminal 25 is input and analyzed by the read/write controller 32. In response to the analyzed read command, the read/write controller 32 reads data from the address in memory cell 31 indicated by the address counter 33, and outputs the data to the printer 100 via I/O terminal 21.

As noted, the circuit board 10 of the first embodiment 10 is provided with ground terminals 24, 27 located at two sides that are susceptible to faulty terminal-contact pin contact, thereby reducing or eliminating the likelihood that the printer [will detect that?] ground terminals 24, 27 and the ground terminal contact pins P4, P7 are in respective contact while the other terminals 21–23, 25, 26 are not in respective contact with contact pins P1–P3, P5, P6. As a result, ink cartridge installation may be detected accurately. It is additionally possible to avoid the problem of an inability to access the storage device 30 despite detecting installation of the ink cartridge.

Typically, where the ratio of circuit board 10 widthwise dimension to ink cartridge 40 depthwise dimension is large, as in the present embodiment, slight misalignment of the ink cartridge during installation can easily result in significant misalignment of circuit board terminals with the corresponding contact pins, so that terminals do not contact the corresponding contact pins. With the circuit board 10 of the present embodiment, however, installation of the ink cartridge can be detected accurately despite the large external dimensions of the circuit board and ink cartridge.

Further, as the ground terminals 24, 27 are not the terminals in closest proximity to the power supply terminal 22, short-circuiting between the power supply terminal 22 and the ground terminals 24, 27 may be prevented. Since the clock terminal 26 is located between the ground terminals 24, 27, the clock signal CLK may be stabilized.

D. Other Embodiments

Figure 8:
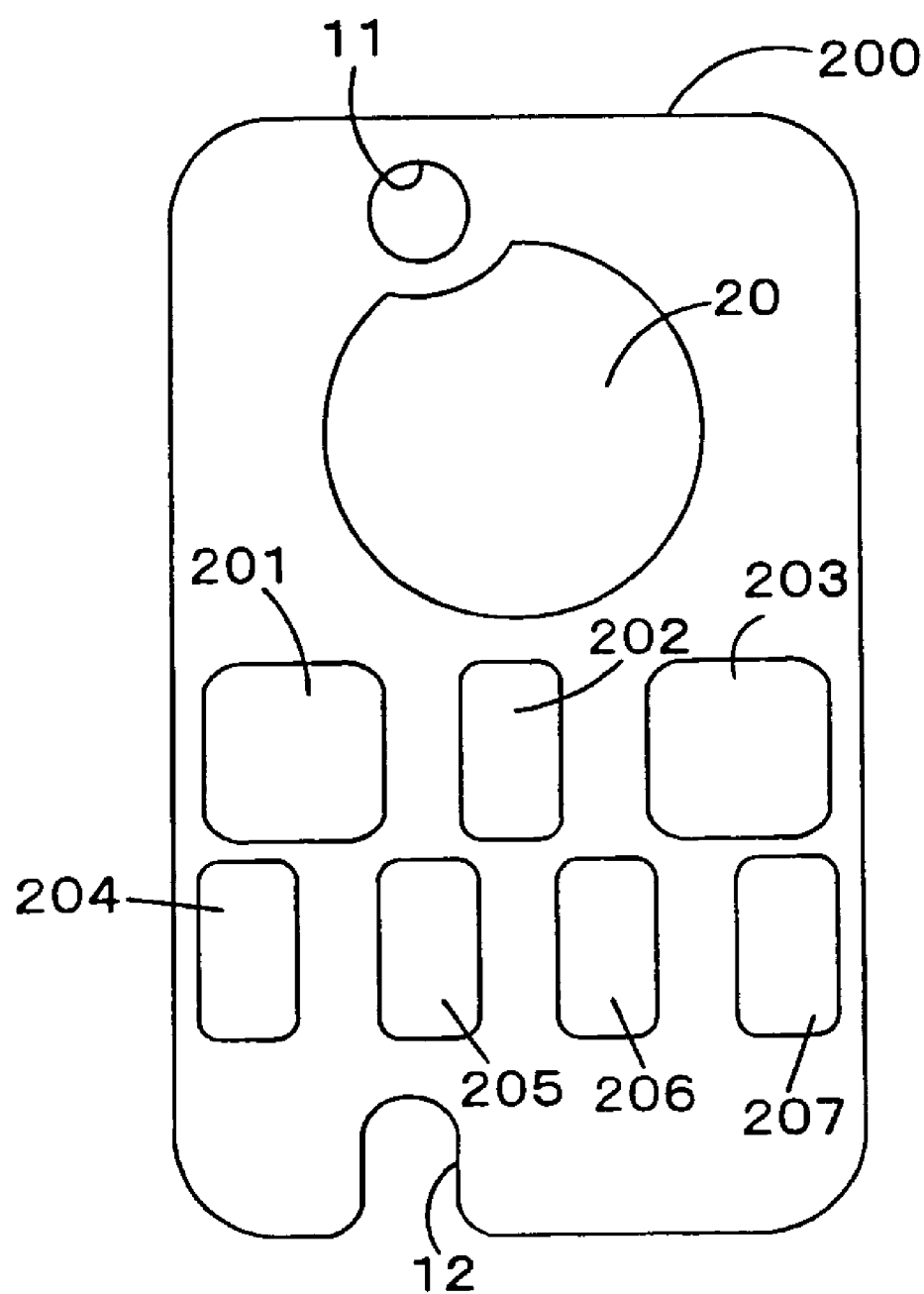
FIG. 8 is an illustrative diagram of an exemplary circuit board terminal arrangement pertaining to a second embodiment.
Figure 9:
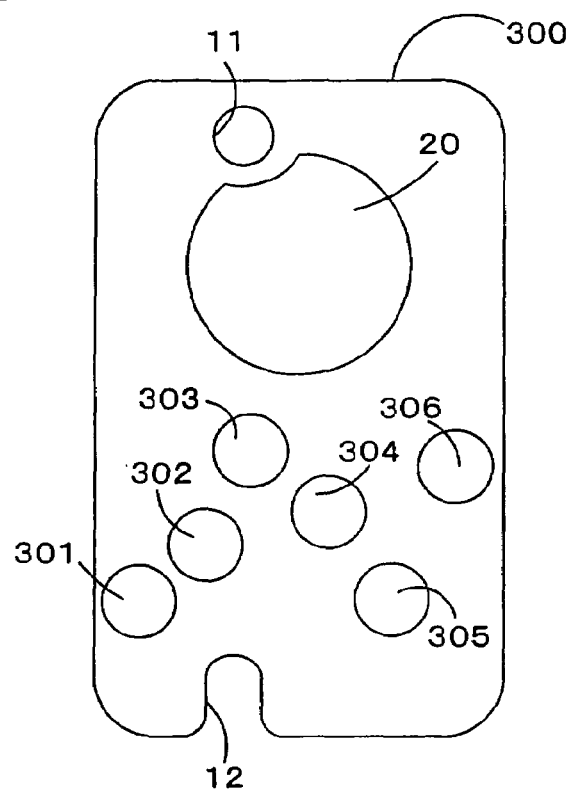
FIG. 9 is an illustrative diagram of an exemplary circuit board terminal arrangement pertaining to a third embodiment.
Figure 10:
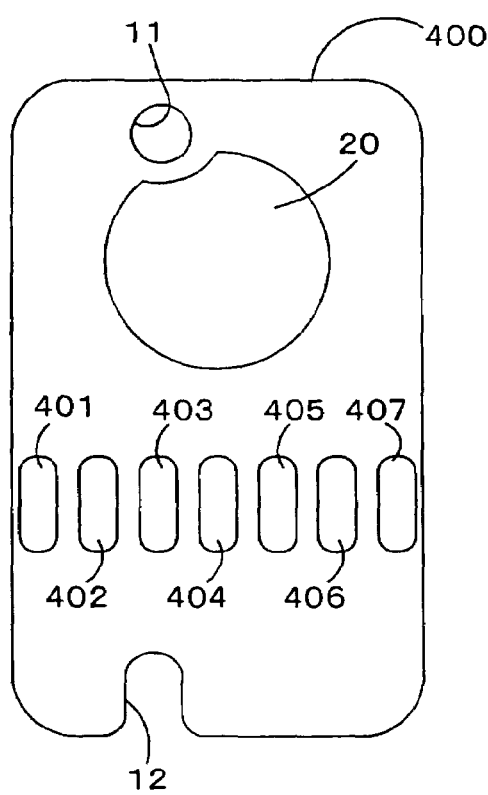
FIG. 10 is an illustrative diagram of an exemplary circuit board terminal arrangement pertaining to a fourth embodiment.

The following description of other embodiments makes reference to FIGS. 8–10. FIG. 8 is an illustrative diagram of an exemplary circuit board terminal arrangement pertaining to a second embodiment. FIG. 9 is an illustrative diagram of an exemplary circuit board terminal arrangement pertaining to a third embodiment. FIG. 10 is an illustrative diagram of an exemplary circuit board terminal arrangement pertaining to a fourth embodiment. As the circuit boards pertaining to the second to fourth embodiments have arrangements similar to those of circuit board 10 pertaining to the first embodiment, elements having the same function are assigned the same symbols used in the first embodiment and are not described in unnecessary detail.

The following description of a second embodiment makes reference to FIG. 8. The circuit board 200 pertaining to the second embodiment is provided in the upper half of its juxtaposed face 13 with a substantially circular test terminal 20 used to test the storage device 30 when shipped from the factory, and in the lower half of its juxtaposed face 13 with a plurality of substantially rectangular terminals 201–207, arrayed in two rows, i.e., an upper and lower row. Of the plurality of rectangular terminals, those in the upper row are, proceeding from the left in the drawing, an I/O terminal 201 for data input/output, a power supply terminal 202 for supplying power, and a chip select terminal 203 for input of a chip select signal for selectively activating storage device 30. The terminals in the lower row are, proceeding from the left in the drawing, a ground terminal 204, a read/write terminal 205 for inputting read/write control signals for storage device 30, a clock terminal 206 for inputting a clock signal (sync signal) for storage device 30, and a ground terminal 277.

As will be apparent from FIG. 8, in the circuit board 200 pertaining to the present embodiment, the ground terminals 204, 207 are located at two edges thereof. I/O terminal 201 and chip select terminal 203 are wider than the I/O terminal 21 and chip select terminal 23 in the first embodiment, but notwithstanding, ground terminals 204, 207 are located at two edges of circuit board 100, with the other terminals 202, 205, 206 being located further inward from the ground terminals 204, 207. The clock terminal 206 is located between the ground terminals 204, 207. The ground terminals 204, 207 are placed in a different row from the power supply terminal 222, and are not the terminals in closest proximity to the power supply terminal 202.

Accordingly, by using the circuit board 200 pertaining to the second embodiment, it is possible to accurately detect installation of the ink cartridge. It is also possible to avoid situations of an inability to access the storage device 30 despite detecting installation of the ink cartridge. Further, the clock signal CLK can be stabilized, and short-circuiting between the power supply terminal 202 and the ground terminals 204, 207 may be prevented.

The following description of a third embodiment makes reference to FIG. 9. The circuit board 300 pertaining to the third embodiment is provided in the upper half of its juxtaposed face 13 with a substantially circular test terminal 20 used to test the storage device 30 when shipped from the factory, and in the lower half of its juxtaposed face 13 with a plurality of circular terminals 301–306, arrayed randomly. The circular terminals are, proceeding from the left in the drawing, a ground terminal 301, a read/write terminal 302 for inputting read/write control signals for storage device 30, a clock terminal 303 for inputting a clock signal (sync signal) for storage device 30, a power supply terminal 304 for supplying power, an I/O terminal 305 for data input/output, and a ground terminal 306.

As will be apparent from FIG. 9, in the circuit board 300 pertaining to the present embodiment, the ground terminals 301, 306 are located at two edges thereof, with the other terminals 302–305 being located further inward from the ground terminals 301, 306. The ground terminals 301, 306 are not the terminals in closest proximity to the power supply terminal 304.

Accordingly, by using the circuit board 300 pertaining to the third embodiment, it is possible to accurately detect installation of the ink cartridge. It is also possible to avoid situations of an inability to access the storage device 30 despite detecting installation of the ink cartridge. Further, short-circuiting between the power supply terminal 304 and the ground terminals 301, 306 may be prevented.

The following description of a fourth embodiment makes reference to FIG. 10. The circuit board 400 pertaining to the fourth embodiment is provided in the upper half of its juxtaposed face 13 with a substantially circular test terminal 20 used to test the storage device 30 when shipped from the factory, and in the lower half of its juxtaposed face 13 with a plurality of substantially rectangular terminals 401 to 407, arrayed in a single row. The substantially rectangular terminals are, proceeding from the left in the drawing, a ground terminal 401, a read/write terminal 402 for inputting read/write control signals for storage device 30, a clock terminal 403 for inputting a clock signal (sync signal) for storage device 30, a power supply terminal 404 for supplying power, an I/O terminal 405 for data input/output, a chip select terminal 306 for inputting a chip select signal, and a ground terminal 307.

As will be apparent from FIG. 10, in the circuit board 400 pertaining to the present embodiment, the ground terminals 401, 407 are located at two outermost edges thereof, with the other terminals 402 to 406 being located further inward from the ground terminals 401, 407. The ground terminals 401, 407 are not the terminals in closest proximity to the power supply terminal 404.

Accordingly, by using the circuit board 400 pertaining to the fourth embodiment, it is possible to accurately detect installation of the ink cartridge. It is also possible to avoid situations of an inability to access the storage device 30 despite detecting installation of the ink cartridge. Further, short-circuiting between the power supply terminal 404 and the ground terminals 401, 407 may be prevented.

While the circuit board herein has been described hereinabove with reference to certain preferred embodiments, these merely facilitate understanding of the invention, and are not limiting thereof. It is of course to be understood that a variety of modifications and improvements are possible within the scope of the invention as set forth in the claims, and that the invention includes these equivalents.

Figure 11:
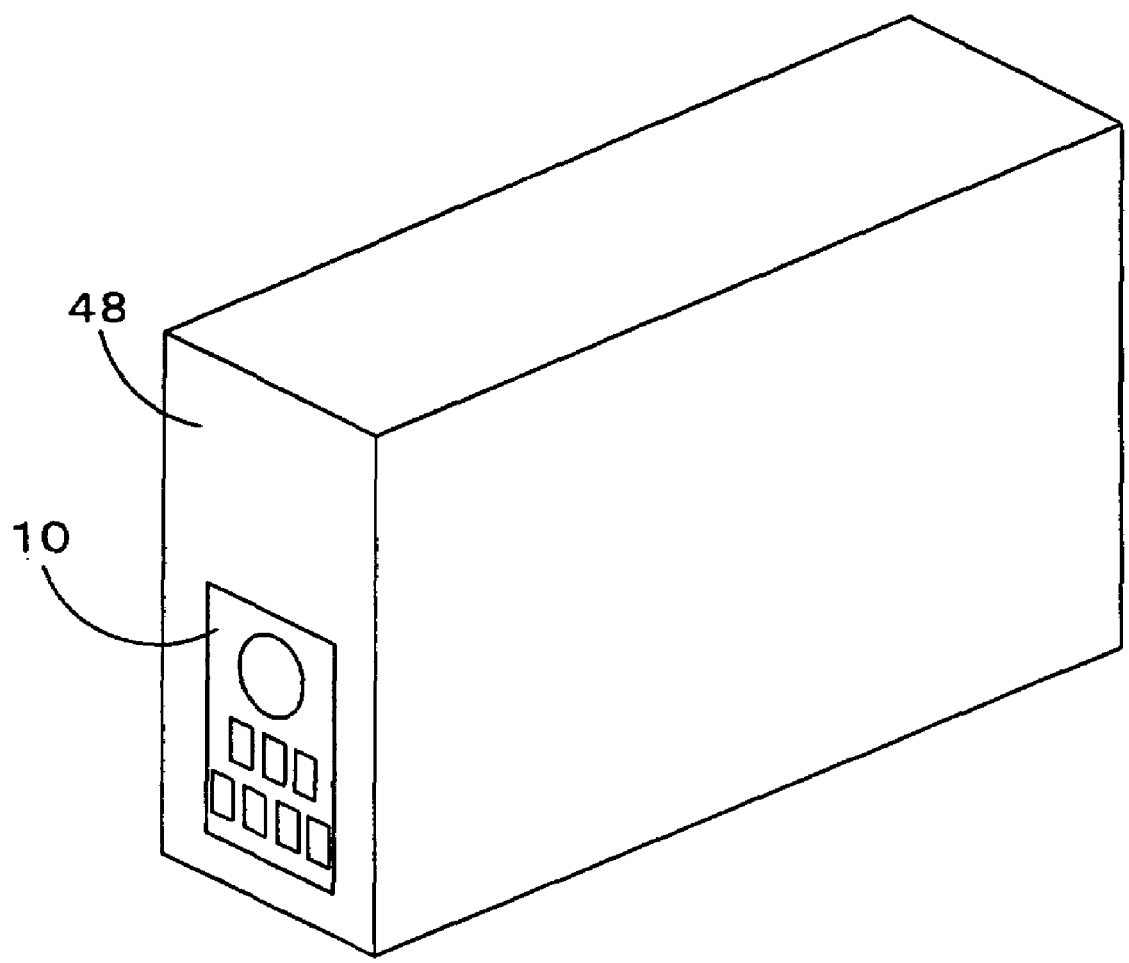
FIG. 11 is a perspective view of the general scheme of an on carriage type ink cartridge comprising the circuit board of the first embodiment.
Figure 12:
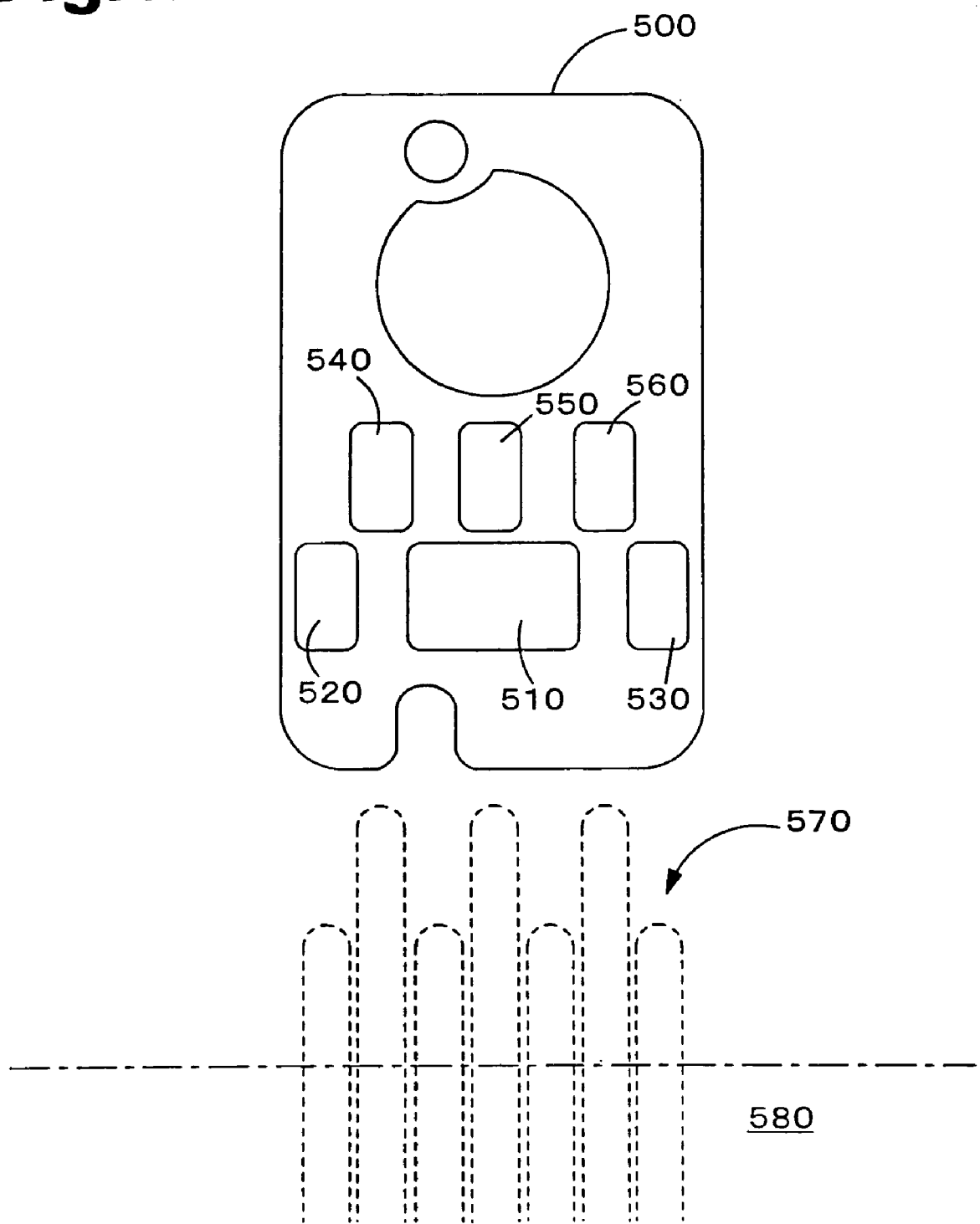
FIG. 12 is an illustrative diagram of a conventional board terminal arrangement.

For example, in the first embodiment, circuit board 10 is described in terms of being mounted on an ink cartridge 40 for use in an off cartridge type printer, but it could also be mounted on an ink cartridge 48 for use in an on cartridge type printer, as shown in FIG. 11. In this case as well, by using the circuit board 10, 200, 300 or 400 pertaining to the first to fourth embodiments, it is possible to accurately detect installation of the ink cartridge, and to avoid situations of an inability to access the storage device 30 despite detecting installation of the ink cartridge.

The terminal arrangements described in the preceding embodiments are merely exemplary; it is sufficient to locate the ground terminals at two edges of the circuit board. Or, where terminals are arranged in a plurality of rows, they may be located at the outermost ends of one of the rows. The working effects of the invention may be achieved with the proviso that such an arrangement is provided.

Whereas in the first embodiment the circuit board 10 is mounted on an ink cartridge 40 the circuit board 10 could be mounted on a toner cartridge. Mounting on a toner cartridge experiences problems similar to those encountered with mounting on an ink cartridge, and these problems may be solved through the use of circuit board 10.

Whereas in the first embodiment the relationship of the depthwise dimension of ink cartridge 40 to the widthwise direction of circuit board 10 is 15:1, the ratio of dimensions of the two is not limited thereto. Exemplary values of 10:1 to 30:1 could be used, for example. In any case, the working effects of the invention are achieved wherever the ratio of depthwise dimension of ink cartridge 40 to the widthwise direction of circuit board 10 is sufficiently great that improper installation of ink cartridge 40 prevents proper contact with circuit board 10.

Obviously, numerous modifications and variations of the present invention are possible in light of the above teachings. For example, features described for certain embodiments may be combined with other embodiments described herein. It is therefore to be understood that within the scope of the appended claims, the invention may be practiced otherwise than as specifically described herein.

This document is based on the Japanese Application to which priority is claimed, the entire contents of which being incorporated herein by reference.

What is claimed is:
1. An ink cartridge, comprising:
a receptacle having an ink chamber for storing ink; and
a circuit board having a storage device for storing data relating to ink; and the ink, said circuit board being disposed on the receptacle and comprising;

at least two ground terminals, each having a ground contact portion that are located on one axis thereof, said ground contact portions being arranged in a first row having outermost ends; and a plurality of terminals, each having a contact portion, arranged on said circuit board, for read/write operations on said data relating to the ink, said plurality of terminals including a power supply terminal, said contact portion of said power supply terminal being arranged in a second row parallel to said first row;

wherein said ground contact portions are not the terminal contact portions in closest proximity to said power supply terminal contact portion and are located at the outermost ends of said first row, and wherein said first row is located further from a center of the circuit board than the second row.

2. An ink cartridge, comprising:

a receptacle having an ink chamber for storing ink; and a circuit board having a storage device for storing data relating to the ink, said circuit board being disposed on the receptacle and comprising;

at least two ground terminals that are located on one axis thereof, said ground terminals being arranged in a first row; and a plurality of terminals arranged on said circuit board, for read/write operations on said data relating to the ink, said terminals including a power supply terminal, at least some of said plural terminals being arranged in a second row parallel to said first row, each said row having outermost ends, wherein said at least two ground terminals are not the terminals in closest proximity to said power supply terminal and are located at the outermost ends of said first row, and wherein said first row of terminals is located further from a center of the circuit board than the second row.

3. An ink cartridge according to claim 2, wherein said terminals include a clock signal terminal, said clock signal terminal being located between two of said at least two ground terminals.

4. An ink cartridge according to claim 2, wherein said two of said at least two ground terminals and said power supply terminal are located in different said rows.

5. An ink cartridge according to any one of claims 1, 2, 3 and 4, wherein said terminals are arranged at intervals of approximately 1 mm in the row formation direction.

6. An ink cartridge, comprising:

a receptacle having an ink chamber for storing ink; and a circuit board comprising:

a storage device for storing data relating to the ink, said circuit board having a substantially rectangular shape, wherein said circuit board comprises:

two ground terminals along one side thereof, said ground terminals being arranged in a first row having outermost ends; and a plurality of terminals arranged parallel to one side of said circuit board, and used for storing said data, said plurality of terminals including a power supply terminal, at least some of said terminals being arranged in a second row parallel to one side of said circuit board and parallel to said first row, wherein said two ground terminals are not the terminals in closest proximity to said power supply terminal, and are arranged at the outermost ends of said first row, and wherein said first row of terminals is located further from a center of the circuit board than the second row.

7. An ink cartridge according to claim 6, wherein said plurality of terminals includes a clock signal terminal, and said two ground terminals and said clock signal terminal are located in said first row, and said power supply terminal is located in said second row.

8. An ink cartridge, comprising:

a receptacle having an ink chamber for storing ink; and a circuit board comprising:

a storage device for storing data relating to the ink;

a plurality of terminals arranged on said circuit board, said terminals including a power supply terminal, the terminals being arranged in a plurality of rows, wherein two of said terminals are ground terminals arranged so that a printing device can determine if the ink cartridge has been installed correctly, where said ground terminals are located at the outermost ends of a first said row of said terminals that is different from a second said row of said terminals that contains said power supply terminal, said first and said second rows being parallel, wherein said ground terminals are not the terminals in closest proximity to said power supply terminal, and wherein said first row of terminals is located further from a center of the circuit board than the second row.

9. An ink cartridge according to claim 8, wherein said power supply terminal is located at a center of the second row.

10. An ink cartridge according to claim 8 or 9, wherein the first row contains four terminals and the second row contains three terminals.

11. An ink cartridge according to claim 8 or 9, wherein the terminals in the second row containing said ground terminals and the terminals in the first row containing said power supply terminal are arranged in alternating fashion.

12. An ink cartridge according to claim 11, wherein said ink cartridge is one of liquid ink cartridge and a toner cartridge.

13. A printing system comprising:

an ink cartridge according to claim 8; and a printing device that comprises a plurality of contact pins for contacting said ground terminals;

wherein said printing device measures electrical continuity between said contact pins and said ground terminals when said ink cartridge is installed correctly.

14. An ink cartridge for use in a printer having a plurality of electrical contacts, comprising:

a receptacle having an ink chamber for storing ink, a top surface, a bottom surface, and a recessed circuit board mounting portion; and a circuit board having a storage device for storing data relating to the ink, and both a circular opening and a notch for positioning when said circuit board is attached to the receptacle, said circuit board being disposed in the recessed circuit board mounting portion and comprising;

at least two ground terminals that are electrically connected together, each having a ground contact portion, said ground contact portions being arranged in a first row having outermost ends, said ground terminals not being electrically connected to the storage device; and a plurality of terminals, each having a contact portion, arranged on said circuit board, for read/write operations on said data relating to the ink, said plurality of terminals including a power supply terminal, said contact portion of said power supply terminal being arranged in a second row parallel to said first row;

wherein said at least two ground contact portions are not the terminal contact portions in closest proximity to said power supply terminal contact portion and are located at the outermost ends of said first row, wherein said first row is located further from a center of the circuit board than the second row, wherein said ground contact portions and said terminal contact portions are staggered so that, during mounting on the printer, the printer contacts corresponding respectively to the terminals of the first row do not touch the terminals of the second row, and wherein said contact portions lie in a plane that is parallel to and disposed between the top surface and the bottom surface of the receptacle.

* * * * *